US006927018B2

(12) United States Patent
Burgess

(10) Patent No.: US 6,927,018 B2
(45) Date of Patent: Aug. 9, 2005

(54) THREE DIMENSIONAL PRINTING USING PHOTO-ACTIVATED BUILDING MATERIALS

(75) Inventor: Robert Burgess, Corvallis, OH (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 112 days.

(21) Appl. No.: 10/055,487

(22) Filed: Oct. 29, 2001

(65) Prior Publication Data
US 2003/0082487 A1 May 1, 2003

(51) Int. Cl.[7] .............................. G03F 7/16; G03F 7/20; G03F 7/40; B29C 35/08; B41J 2/015
(52) U.S. Cl. ....................... 430/324; 430/327; 430/328; 430/330; 430/394; 264/401; 347/2; 347/51; 347/62; 347/67; 347/102
(58) Field of Search ................................ 430/324–325, 430/327–330, 394; 264/401; 347/2–4, 51, 62, 67, 102

(56) References Cited

U.S. PATENT DOCUMENTS

| 4,029,006 | A | * | 6/1977 | Mercer | 101/35 |
| 4,492,966 | A | * | 1/1985 | Seki et al. | 346/33 A |
| 5,303,141 | A | * | 4/1994 | Batchelder et al. | 264/401 |
| 5,764,263 | A | * | 6/1998 | Lin | 347/101 |
| 5,980,812 | A | * | 11/1999 | Lawton | 264/401 |
| 6,126,884 | A | * | 10/2000 | Kerekes et al. | 264/401 |
| 6,180,050 | B1 | * | 1/2001 | Arai et al. | 264/401 |
| 6,214,276 | B1 | * | 4/2001 | Gelbart | 264/401 |

* cited by examiner

Primary Examiner—Mark F. Huff
Assistant Examiner—John Ruggles

(57) ABSTRACT

The present invention provides a method, article of manufacture and system for fabricating an article using photo-activatable building material. The method includes the steps of applying a layer of the photo-activatable building material to a preselected surface, scanning the layer using a plurality of light-emitting centers to photo-activate the layer of photo-activatable building material in accordance with a predetermined photo-initiation process to obtain polymerization of the building material, wherein scanning is accomplished at a predetermined distance using a predetermined light intensity, and repeating the steps of applying the layer, with each layer being applied to an immediately previous layer, and scanning the layer with the plurality of light-emitting centers to polymerize the building material until the article is fabricated.

22 Claims, 7 Drawing Sheets

THREE DIMENSIONAL PRINTING USING PHOTO-ACTIVATED BUILDING MATERIALS

BACKGROUND OF THE INVENTION

The present invention relates to fabrication of articles, and in particular, fabrication of articles using a sequential layering technique.

Recently, three-dimensional prototypes of articles have been fabricated by applying a layer of build material to a base, and then applying a binding liquid to the build material to bind the build material, with the two steps being repeated until the article has been completed. However, such a technique may often be hampered by the binding liquid's somewhat uneven absorption by the build material as well as uneven application of the binding liquid due to mechanical application inefficiencies. When binding liquid is not applied to a portion of the build material, that portion is structurally weak. When the article fabricated by the build material-binding liquid process is completed, such an article may readily break or crumble in the area in which binding liquid was not applied. Also, where the binding liquid is not evenly absorbed or is unevenly applied, distortion may occur in the fabricated article.

In conventional stereolithography technology, a liquid layer of a photopolymer composition is hardened using a laser beam that scans the surface of the photopolymer composition in a special three-dimensional reservoir. Layers of liquid photopolymer are hardened in the reservoir by scanning a focused laser in a predetermined three-dimensional pattern. This method requires a special reservoir. In addition, the use of a single point source, the laser beam, for hardening the photopolymer is inefficient and may not effectively harden all of the photopolymer, producing an object that has weakened areas.

Thus, there is a need for a method and apparatus that provide for efficiently binding build material to fabricate articles.

SUMMARY OF THE INVENTION

The present invention sets forth an article of manufacture, a system and efficient method for fabricating an article using photo-activatable building material. According to the method, first, a layer of a photo-activatable building material is applied to a preselected surface. Then, the layer is scanned using a plurality of light-emitting centers to photo-activate the layer of photo-activatable building material in accordance with a predetermined photo-initiation process to obtain polymerization of the building material. The scanning is accomplished at a predetermined distance using a predetermined light intensity. The steps of applying the layer, with each layer being applied to an immediately previous layer, and scanning the layer with the plurality of light-emitting centers to polymerize the building material are repeated until the article is fabricated.

DETAILED DESCRIPTION OF THE PREFERRED EMBODIMENT

Figure 1:
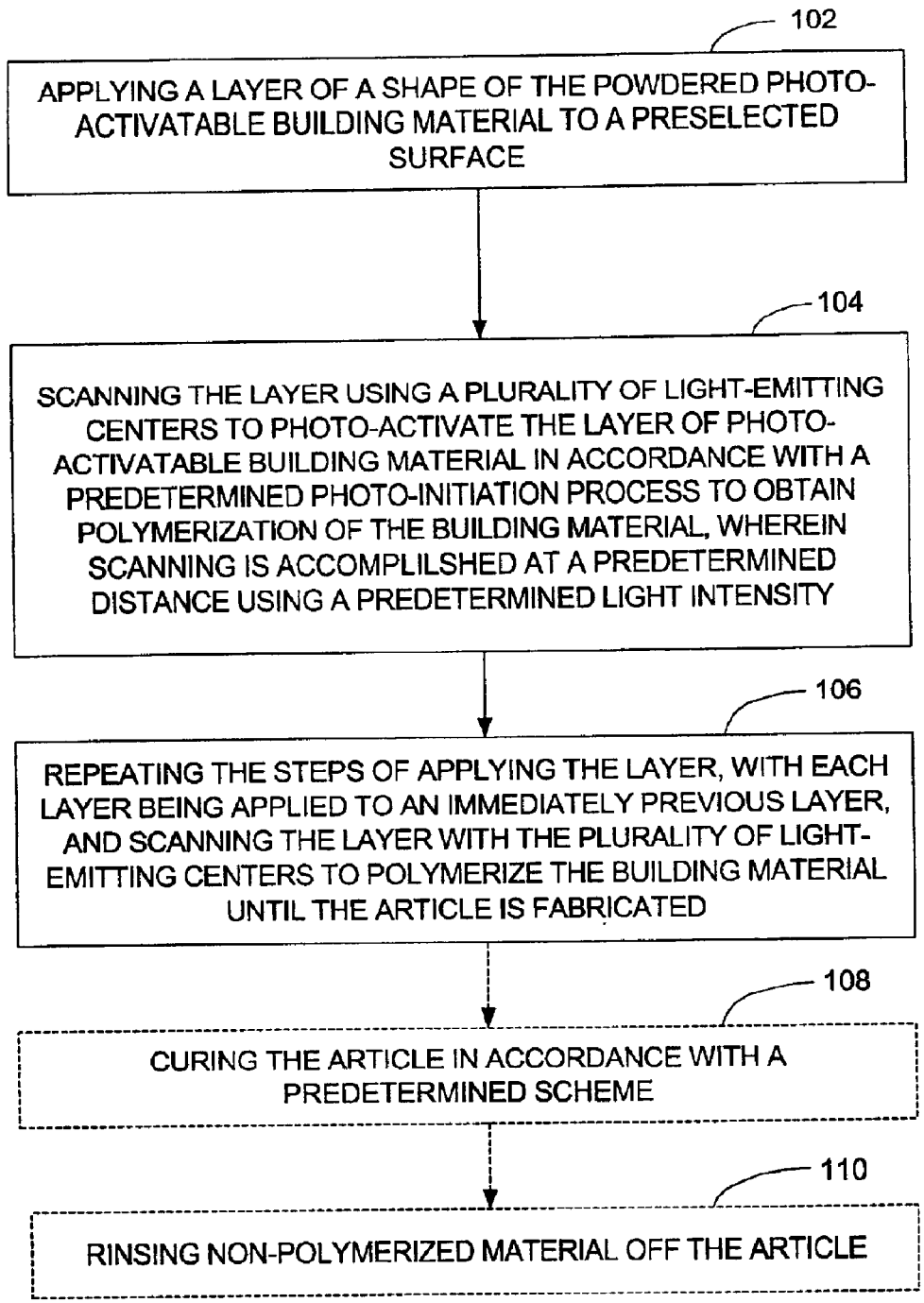
FIG. 1 is a flow chart showing steps for one embodiment of a method in accordance with the present invention.

The present invention provides an efficient method, a system and an article fabricated using the method for fabricating an article using photo-activatable building material. In the present invention, light-emitting centers are fabricated as an array of photon sources whose size, wavelengths and intensity can be designed and optimized for particular applications. The details of the number of light centers and their spacings are determined as a function of the resolution required to fabricate a particular size of the article design in accordance with known requirements for photo-initiated polymerization. For example, if a thicker photoresist is to be utilized, more light-emitting centers with higher intensity may be added to decrease the fabrication time. Alternatively, if a higher resolution of article dimensions is required, shorter wavelength photon sources with lower intensity may be utilized to photo-polymerize a thinner photoresist layer. A three-dimensional structure of an article is fabricated by successively laying down a plurality of thin layers of photo-activated building material and photo-activating each layer before applying the next layer. The shape of the layers is typically determined by a computer software program that guides the supply unit that supplies the photo-activated building material that results in deposition of a desired thickness of the building material. It is known in the art how to, via computer, sub-divide a three-dimensional view of a proposed article into a plurality of thin layers. The computer program uses the dimensions of the thin layers to determine the path for the supply unit to follow. As is known in the art, the supply unit moves incrementally upward after application of each layer, permitting the supply unit to move horizontally, for example in a raster fashion, to, after polymerization of the layer by photo-activation, spread the next thin layer of building material. Photo-activation is accomplished by "printing" the layer with the light-emitting array, wherein the light-emitting array passes a predetermined distance over the current layer, photo-activating the layer using the light-emitting centers. When the article has been entirely fabricated and if the photo-activated polymer requires curing, the article is placed in a curing oven and heated to a predetermined temperature for a predetermined length of time. For example, when using Shipley Microposit S1800 Series Photo Resists as the photo-activated building material, the article is typically cured in accordance with a standard curing process for the using Shipley Microposit S1800 Series as is known to those skilled in the art. After curing, the article may be rinsed to remove any unpolymerized material that may be on the surface. The Shipley Microposit S1800 Series Photo Resists are positive photoresists suitable for using as photo-activatable building materials for the present invention. The Shipley Microposit S1800 Series Photo Resists are optimized for G-line (0.436 microns)

exposure, are effective for broad band exposure and have high resolution process parameters. For example, Shipley Microposit S1813 has a 12.3 micrometer thickness, requires 150 mJ/cm2 for polymerization ("printing"), and may be polymerized at the G-line (0.54 NA).

FIG. 1 is a flow chart showing steps for one embodiment of a method in accordance with the present invention. Typically, a computer program has been previously prepared, showing the thin layers of the article to be fabricated. This computer program is used to provide control of the supply unit that applies the photo-activated material in layers. First, a layer of a shape of the photo-activatable building material is applied 102 to a preselected surface. Then, using the array of light-emitting centers, the layer of photo-activatable building material is scanned 104 to activate it in accordance with a predetermined photo-initiation process to obtain polymerization of the building material. Then, another thin layer of photo-activatable building material is applied. Depending on the selection of the photo-activatable building material, a thickness of approximately 0.5 micron to 10 mils may be used. Then, the latest applied thin layer undergoes a photo-initiation process in accordance with a known exposure time for the selected photo-activated building material. The steps of applying 102 the layer, with each layer being applied to an immediately previous layer, and scanning 104 the layer to photo-activate the building material are repeated 106 until the article is fabricated. Then, if the selected photo-activatable building material requires curing, the article is cured 108 in accordance with a predetermined scheme associated with the selected photo-activatable building material. Where desired, non-polymerized material may be rinsed off 110 of the fabricated article. Typically, the present invention utilizes light-emitting diodes or laser diodes for photo-activation. Where desired, the array of light-emitting centers may include, located at a predetermined distance from the surface, light focusing devices and/or light baffling devices. For example, light focusing devices such as lenses may be installed at each light-center location. The lenses are typically set at predetermined distances from the light-emitting centers, depending on the desired illumination needed.

The layer of the photo-activatable building material may be applied to the preselected surface by, for example, silkscreening, spraying the building material onto the preselected surface, or spinning the building material in a manner that deposits a thin layer of the building material onto the preselected surface in a desired conformation. Alternatively, a process of lowering a platform a predetermined distance into a bath of liquid photo-activatable building material prior to each photo-activation may be utilized to obtain a plurality of photo-activated layers of building material. By lowering the platform a desired distance into the liquid photo-activatable building material and scanning the desired shape into the building material with light-emitting diodes or laser diodes, a layer of photo-activated material is obtained in the desired shape. When the platform is lowered again for the desired distance, the liquid photo-activatable building material covers the already activated building material, and the diodes are used to scan another layer on top of the first layer. This process continues until the desired number of photo-activated layers are obtained and the article is fabricated. Then, if the selected photo-activatable building material requires curing, the article is cured. After curing, the non-polymerized material may be rinsed off 110 the article.

Figure 2:
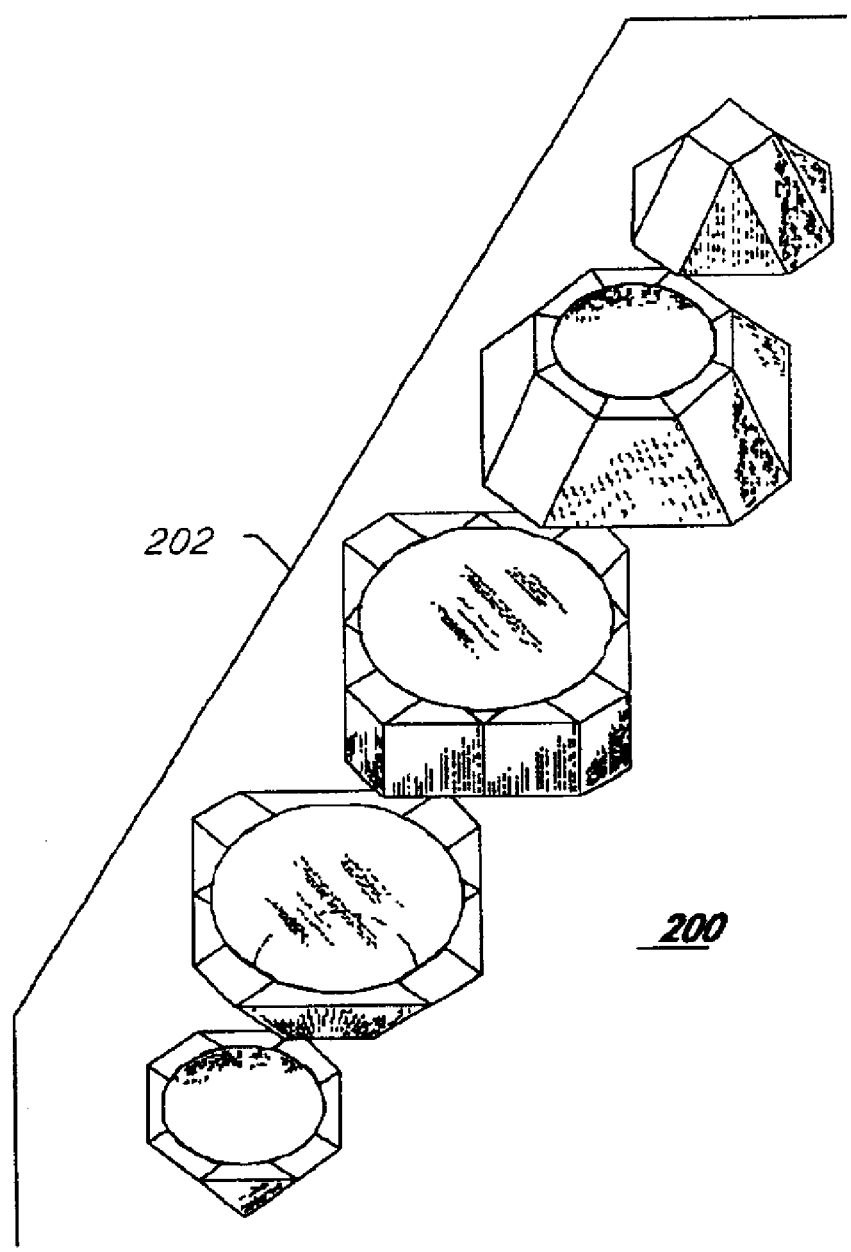
FIG. 2 is a perspective drawing of an article fabricated using photo-activatable building material, wherein the article is fabricated in accordance with the present invention.

FIG. 2 is a perspective drawing of an article 200 fabricated using photo-activatable building material, wherein photo-activation is accomplished using an array of light-emitting centers. The article includes a plurality of thin layers (a plurality of the thin layers comprise each of a plurality of sections 202, and the totality of sections comprise the article), prepared by successively applying thin layers of photo-activatable building material and photo-activating each thin layer prior to applying a next layer thereto to polymerize the photo-activatable building material and attaching each successive layer to a previous layer, and wherein, upon completion of application and photo-activation of the thin layers, if desired, the article may be cured for a predetermined time. As described above, the array typically includes light-emitting centers to provide light, and may also include light focusing devices such as lenses and/or light baffling devices. Lenses may be set at predetermined distances from the light-emitting centers, depending on the photo-activated building material selected and the amount of light needed to accomplish polymerization.

Figure 3:
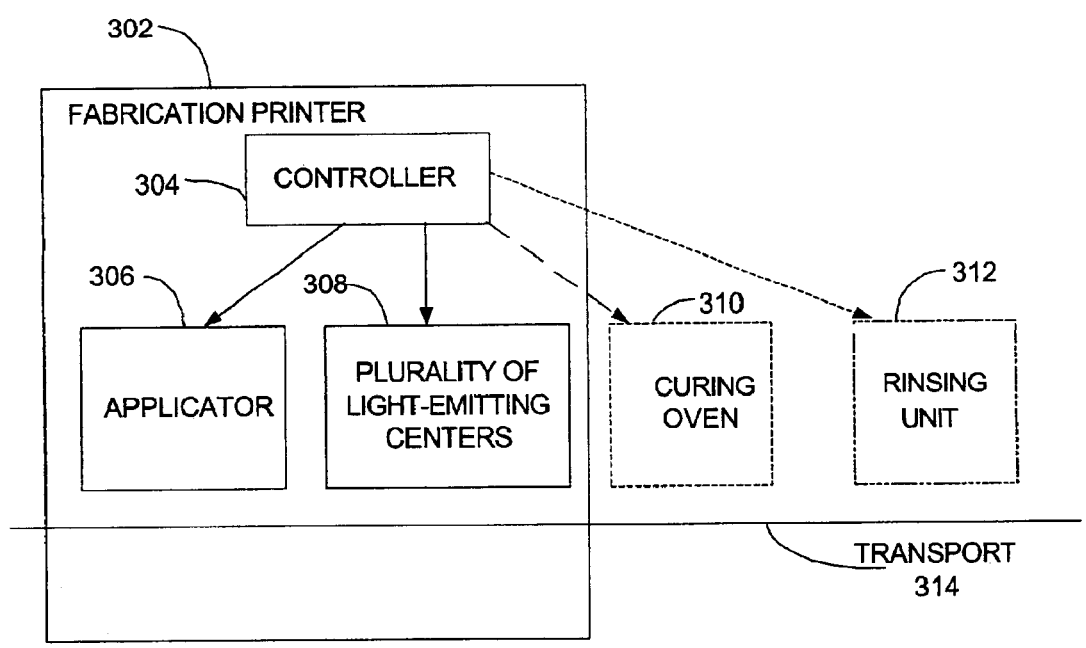
FIG. 3 is a perspective view of one embodiment of a system for fabricating an article using photo-activatable building material in accordance with the present invention.

FIG. 3 is a perspective view of a system for fabricating an article using photo-activatable building material in accordance with the present invention. The system includes a fabrication printer 302 that comprises a controller 304, an applicator 306, and an array of light-emitting centers 308 and also, where desired, includes a curing oven 310. The array of light-emitting centers 308 is a plurality of light-emitting centers that provide light for photo-initiation of the building material. The controller 304 is coupled to the applicator 306, the array of light-emitting centers 308 and, where a curing oven is utilized, to the curing oven 310 and is used for activating the applicator 306 to apply a thin layer of photo-activatable building material in a predetermined shape. The controller 304 also activates the array/plurality of light-emitting centers 308 to photo-activate the thin layer of building material when the thin layer has been applied, and then continues activating the applicator 306 and the array of light-emitting centers 308 successively in accordance with a preselected fabrication scheme until the article is fabricated. The applicator 306 is a supply unit that is coupled to the controller 304 and is used for, in response to signals from the controller 304, applying the thin layer of the photo-activatable building material in the predetermined shape to a preselected surface, as described in greater detail above. The array of light-emitting centers 308 is also coupled to the controller 304, and, upon receiving a signal to photo-activate the thin layer, passes over the thin layer and exposes the thin layer to light to photo-activate the layer of photo-activatable building material in accordance with a predetermined photo-initiation process to obtain polymerization of the building material. The applicator 306 applies each successive layer to an immediately previous layer, and the plurality of light-emitting centers 308 photo-activates each successive layer applied until the article is fabricated. Where curing is desired, a curing oven 310 may be arranged to receive the article from the fabrication printer 302 when the article is completed. Upon direction by the controller 304, the curing oven 310 cures the article in accordance with a predetermined scheme. Again, application of the thin layer is typically accomplished by silkscreening, spraying the building material onto the preselected surface, or spinning the building material in a manner that deposits a thin layer of the building material onto the preselected surface in a desired conformation. Typically, a transport 314, such as a roller assembly moving a suitable surface material proximate to the applicator 306 and the plurality of light-emitting centers 308, for example, is coupled to the controller 304 (not shown) and moves the surface material in accordance with a predetermined scheme to permit the steps of the method of the invention to fabricate the article. Other transport systems are known in the art and, where desired, may also be utilized. Where desired, the controller 304 may also be coupled to the curing oven 310 and the rinsing unit 312, and the rinsing unit 312 may be arranged to receive the article from the curing oven 310 after curing and cooling. The cured article may be rinsed in the rinsing unit 312 to remove non-polymerized material adhering to the outside of the article.

With respect to the light-emitting centers, light-emitting diodes (LEDs) or laser diodes, for example, are typically used in the present invention. Light-emitting diodes suitable for such use are the ultraviolet LEDs CXXX-MB290-E400, which are obtainable from CREE G-SiC Technology. Their dimensions are 300×300 micrometers, sustain a DC forward current of 30 mA, a peak forward current of 100 mA, provide light of wavelength 405 nm with halfwidth 26 nm, and provide a radiant flux of 10–12 mW. Laser diodes, obtainable from Nichia Corporation, suitable for such use may have an optical output power –CW of 8 mW with a pulse of 10 mW, a peak wavelength of 405 nm, and have an operating voltage of 4.5 volts.

Figure 4:
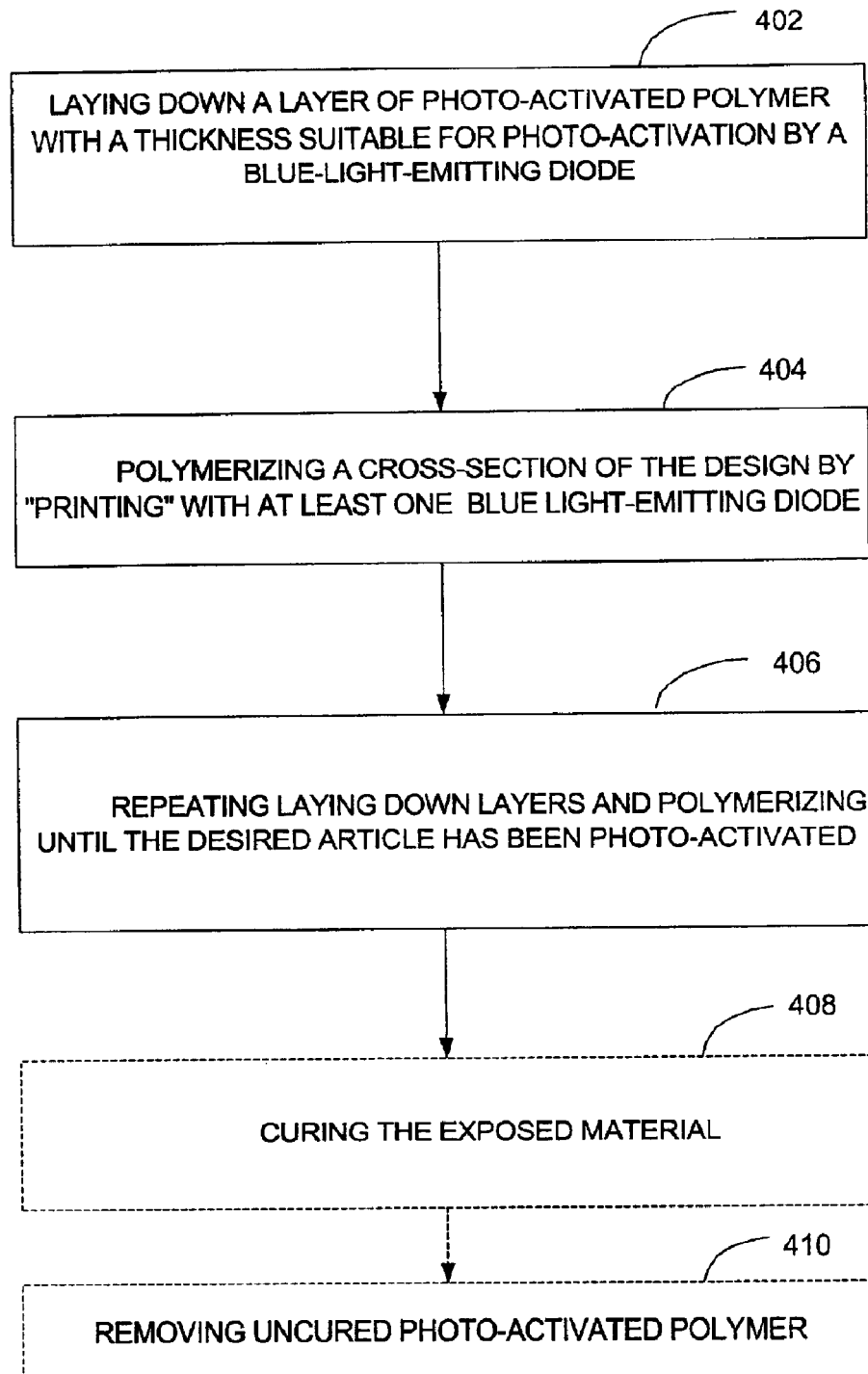
FIG. 4 is a flow diagram showing one embodiment of steps for implementing the method of the present invention wherein blue LED photo-initiated polymerization is used.

As shown in FIG. 4, steps for blue LED photo-initiated polymerization may include laying down 402 a layer of photo-activated polymer with a thickness suitable for photo-activation by a blue light-emitting diode, polymerizing 404 a cross section of the design by "printing" with at least one blue LED, repeating 406 laying down layers and polymerizing until the desired article has been photo-activated. Where desired, the article may be cured 408. Also, where desired, uncured photo-activated polymer may be removed 410, for example, by rinsing the article with water.

In another embodiment of a system for fabricating an article using an array of light-emitting centers, light-emitting centers are fabricated or interfaced to the locations of firing resistors of ink jet printheads of ink jet cartridges. Thermal ink jet printers are known to those skilled in the art and function by thermal ejection of ink from an array of firing resistors onto a medium. One method to utilize this invention to fabricate an article is to modify a thermal ink jet cartridge. Light-emitting centers are fabricated at the locations of the firing resistors of the ink jet printheads on the ink jet cartridges. Orifice plates may include lenses at the orifices or nozzle locations that are designed for a desired working distance and wavelength of the light source. While the present invention is not dramatically changed in this arrangement, the use of the printer and ink jet circuitry makes it unnecessary to construct the entire system since a portion of it is already constructed. The printing of a medium with ink is similar to printing of a photoresist with photons. Each process leaves a difference in the exposed and unexposed medium that can be read. The printer also has the advantage of having a workable interface to a computer that can read and print cross-sections of three dimensional objects.

Figure 5:
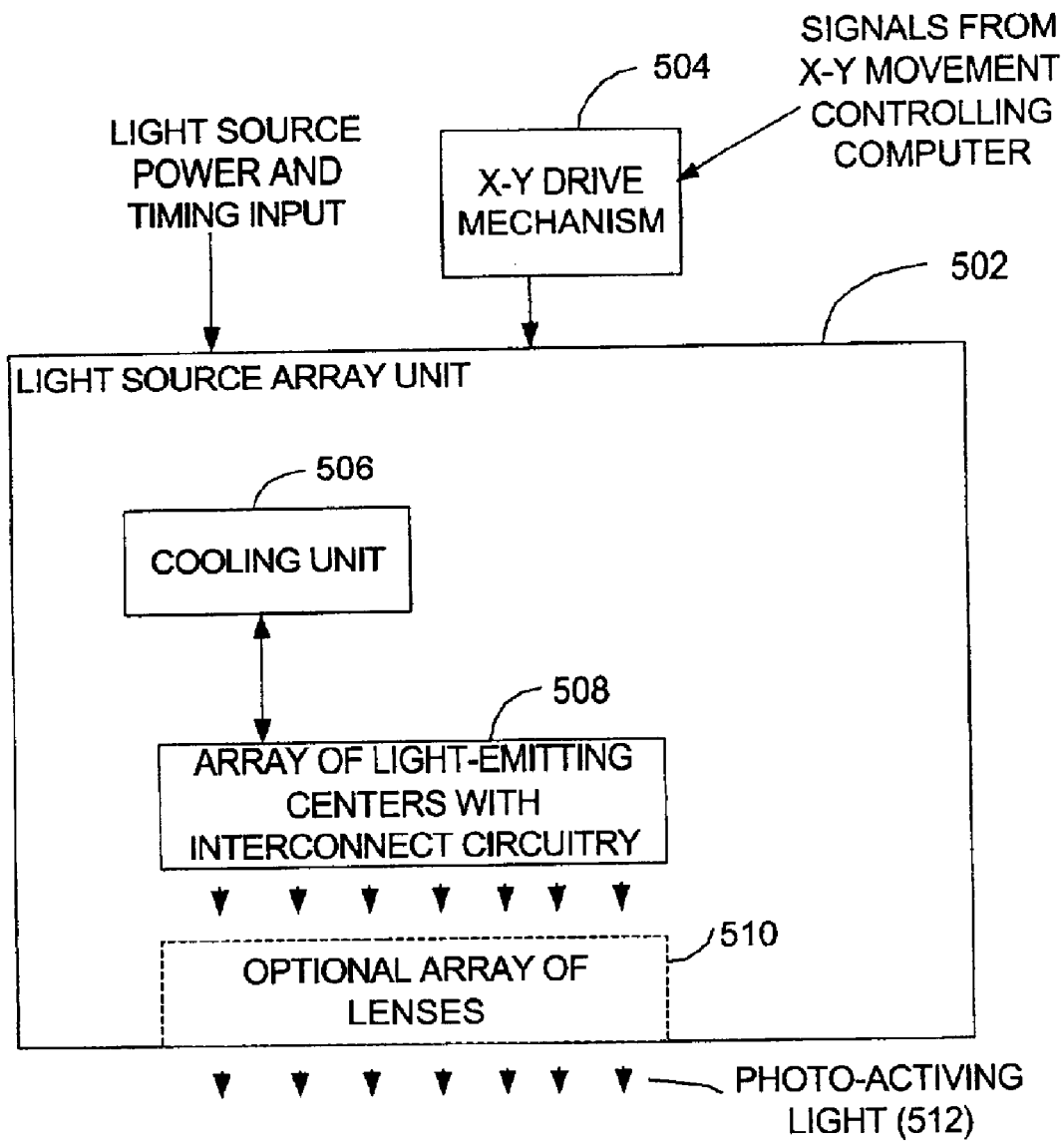
FIG. 5 is a block diagram of one embodiment of a light source array unit in accordance with the present invention.

FIG. 5 is a block diagram of one embodiment of a light source array unit in accordance with the present invention. The light source array unit 502 includes a cooling unit 506 for cooling the light source array unit 502 in accordance with a predetermined scheme. Also, the light source array unit 502 includes an array of light-emitting centers with interconnect circuitry 508 that is utilized to photo-initiate the polymerization process for the layers of building material as described above. Optionally, an array of lenses 510 may be provided that may be used to direct the photo-activating light 512 and adjust its intensity as desired.

Figure 6:
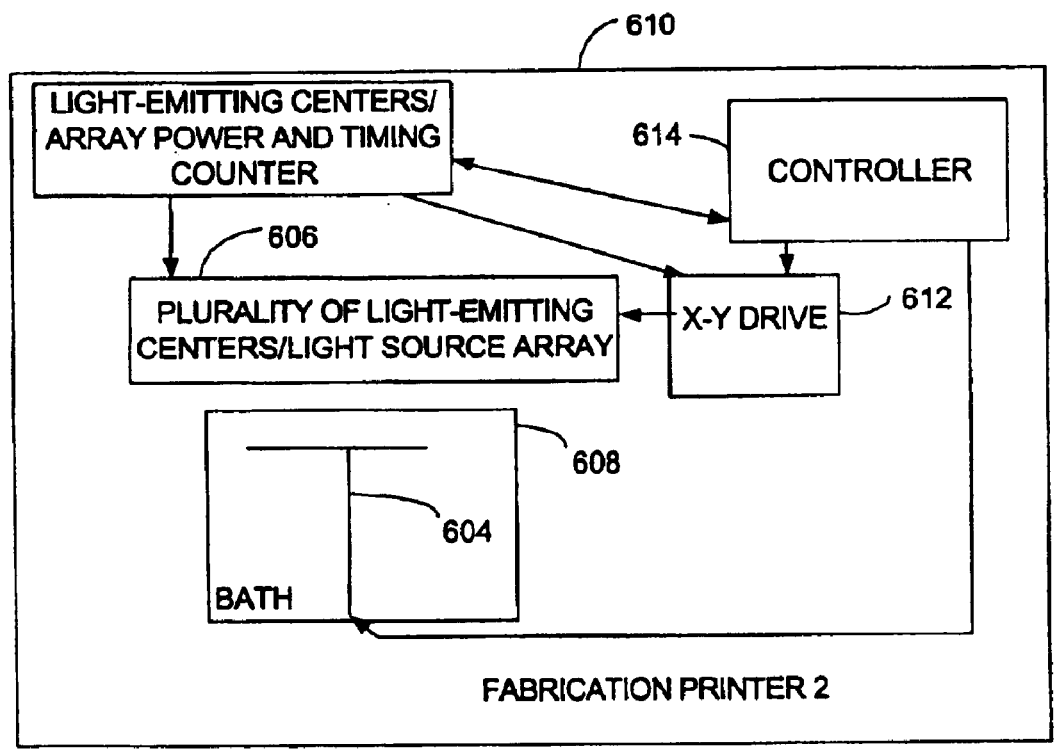
FIG. 6 is a block diagram of another embodiment of a system for fabricating an article using photo-activatable building material in accordance with the present invention.

FIG. 6 is a block diagram of another embodiment of a system for fabricating an article using photo-activatable building material in accordance with the present invention. The fabrication printer 2 610 includes a controller 614 coupled to a light-emitting centers/array power and timing counter, wherein the controller 614 is coupled to an X-Y drive 612 that moves an array of light-emitting centers 606 in accordance with a preselected scheme. The light-emitting centers are coupled to a cooling unit 506 that provides for heat removal from the area of the light-emitting centers.

The fabrication printer 2 610 also includes a platform 604 that is located in a bath of liquid photo-activatable building material 608. The controller 614 sets the height of the platform at a predetermined height so that a predetermined thickness of the photo-activatable liquid is situated on the platform 604. Then the controller activates the X-Y drive 612 to scan a predetermined shape on the platform 604, which photo-activates the photo-activatable liquid that is scanned. In this manner, a layer of photo-activated polymer is provided on the platform 604. This process is repeated until the desired article is fabricated. Then, the article may be removed from the bath and where desired, cured and/or rinsed.

Figure 7:
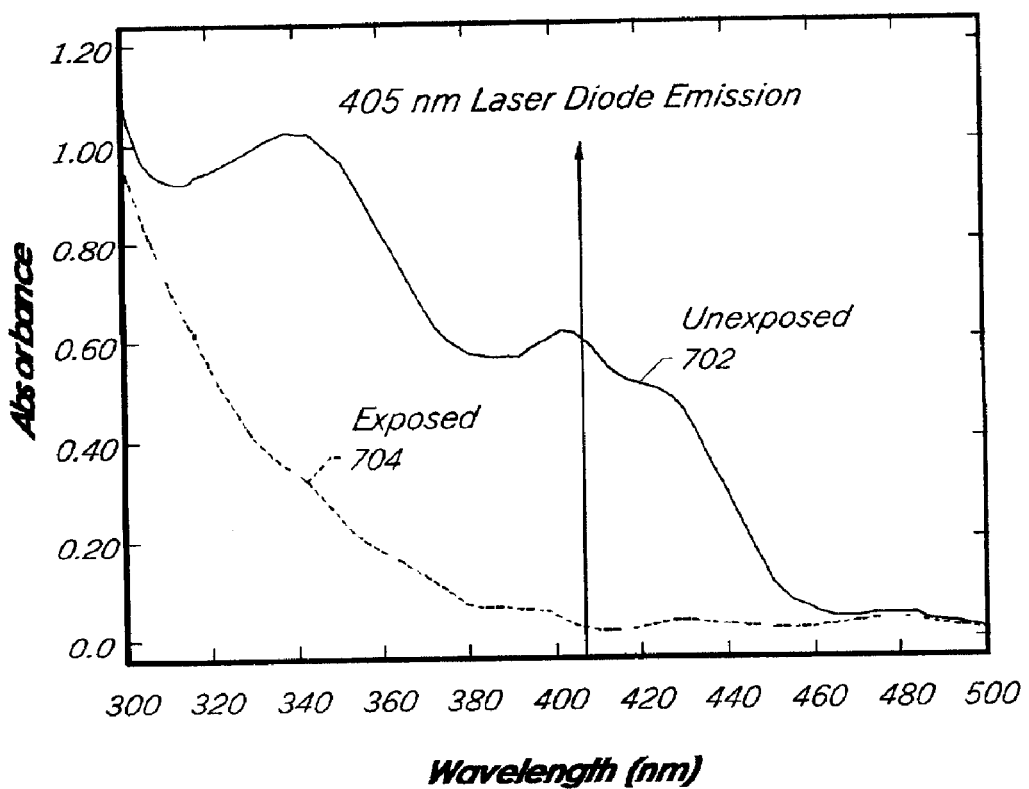
FIG. 7 is a graphical representation of one embodiment of a laser diode emission line in relation to the absorption spectrum for a selected photo-activatable material.

FIG. 7 is a graphical representation of one embodiment of a laser diode emission line in relation to the absorption spectrum for a selected photo-activatable material. In the example shown in FIG. 7, the value of the absorbance of Shipley Microposit S1813 (Unexposed, 702) drops significantly upon exposure (Exposed, 704) to a 405 nm laser diode emission due to polymerization. It will be clear to one skilled in the art that this is just one example, and other suitable photo-activatable materials may also be utilized in a similar fashion.

Thus, methods, systems and an article fabricated according to the present invention have been described. Many modifications and variations may be made to the techniques and structures described and illustrated herein without departing from the spirit and scope of the invention. Accordingly, it should be understood that the method, the system and fabricated article described herein are illustrative only and are not limiting upon the scope of the invention.

What is claimed is:

1. A method for fabricating an article using photo-activatable building material, the method comprising:
   depositing a uniform layer of the photo-activatable building material to a preselected surface with an applicator;
   scanning the layer using a plurality of light-emitting centers to selectively photo-activate the layer of photo-activatable building material in accordance with fabrication of said article;
   repeating the steps of depositing a uniform layer, with each layer being applied over an immediately previous layer, and scanning each layer with the plurality of light-emitting centers to selectively photo-activate the building material until the article is fabricated;
   curing the article in a curing oven following fabrication; and
   automatically transporting the article between said applicator and said curing oven with a transport system;
   wherein scanning is accomplished using a modified printing cartridge that includes light directing devices located in an orifice plate.

2. The method of claim 1, wherein the light directing devices include lenses at nozzle locations and wherein the lenses are set at predetermined distances from the light-emitting centers.

3. A method for fabricating an article using photo-activatable building material, the method comprising:

depositing a uniform layer of the photo-activatable building material to a preselected surface with an applicator;

scanning the layer using a plurality of light-emitting centers to selectively photo-activate the layer of photo-activatable building material in accordance with fabrication of said article; and repeating the steps of depositing a uniform layer, with each layer being applied over an immediately previous layer, and scanning each layer with the plurality of light-emitting centers to selectively photo-activate the building material until the article is fabricated;

wherein said plurality of light-emitting centers are disposed in a modified inkjet print cartridge which is separate from said applicator, wherein said modified inkjet print cartridge is modified to contain said light-emitting centers, said light-emitting centers being formed at or in place of firing resistors of said print cartridge.

4. A method for fabricating an article using photo-activatable building material, the method comprising:

depositing a uniform layer of the photo-activatable building material to a preselected surface with an applicator;

scanning the layer using a plurality of light-emitting centers to selectively photo-activate the layer of photo-activatable building material in accordance with fabrication of said article; and repeating the steps of depositing a uniform layer, with each layer being applied over an immediately previous layer, and scanning each layer with the plurality of light-emitting centers to selectively photo-activate the building material until the article is fabricated;

wherein said plurality of light-emitting centers are disposed in a modified inkjet print cartridge which is separate from said applicator; and wherein said light-emitting centers are formed at or in place of firing resistors of said print cartridge, said light emitting centers are driven by circuitry for driving said firing resistors and light directing devices being disposed in an orifice plate of said print cartridge in correspondence with said light emitting centers.

5. The method of claim 3, wherein the light-emitting centers comprise light-emitting diodes.

6. The method of claim 3, wherein the light-emitting centers comprise laser diodes.

7. The method of claim 3, further comprising light directing devices being disposed in orifices of an orifice plate of said print cartridge, wherein the light directing devices comprise lenses.

8. The method of claim 3, further comprising light directing devices being disposed in orifices of an orifice plate of said print cartridge, wherein the light directing devices comprise baffles.

9. The method of claim 3, wherein depositing a layer of the photo-activatable building material is accomplished by one of: silk-screening, spraying, or spinning the building material in a manner that deposits a uniform layer of the building material onto the preselected surface.

10. The method of claim 3, further including rinsing non-polymerized material off the article with a rinsing unit.

11. The method of claim 10, further comprising automatically transporting said article to said rinsing unit with a transport system.

12. The method of claim 3, further including curing the article with a curing oven.

13. The method of claim 12, further comprising automatically transporting said article to said curing oven with a transport system.

14. The method of claim 4, wherein the light-emitting centers comprise light-emitting diodes.

15. The method of claim 4, wherein the light-emitting centers comprise laser diodes.

16. The method of claim 4, wherein the light directing devices comprise lenses.

17. The method of claim 4, wherein the light directing devices comprise baffles.

18. The method of claim 4, wherein depositing a layer of the photo-activatable building material is accomplished by one of: silk-screening, spraying, or spinning the building material in a manner that deposits a uniform layer of the building material onto the preselected surface.

19. The method of claim 4, further including rinsing non-polymerized material off the article with a rinsing unit.

20. The method of claim 19, further comprising automatically transporting said article to said rinsing unit with a transport system.

21. The method of claim 4, further including curing the article with a curing oven.

22. The method of claim 21, further comprising automatically transporting said article to said curing oven with a transport system.

* * * * *